(12) United States Patent
Ito

(10) Patent No.: US 6,911,623 B2
(45) Date of Patent: Jun. 28, 2005

(54) CARBON DIOXIDE GAS LASER MACHINING METHOD OF MULTILAYER MATERIAL

(75) Inventor: Kenji Ito, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/469,347

(22) PCT Filed: Mar. 20, 2002

(86) PCT No.: PCT/JP02/02687

§ 371 (c)(1),
(2), (4) Date: Aug. 28, 2003

(87) PCT Pub. No.: WO02/081141

PCT Pub. Date: Oct. 17, 2002

(65) Prior Publication Data

US 2004/0094521 A1 May 20, 2004

(30) Foreign Application Priority Data

Apr. 5, 2001 (JP) ........................... 2001-107450

(51) Int. Cl.$^7$ .............................................. B23K 26/38
(52) U.S. Cl. ................................................. 219/121.71
(58) Field of Search ........................... 219/121.61, 121.7, 219/121.71

(56) References Cited

U.S. PATENT DOCUMENTS

| | | | | |
|---|---|---|---|---|
| 5,966,398 A | * | 10/1999 | Karube et al. ................. | 372/58 |
| 6,107,003 A | * | 8/2000 | Kuwako ...................... | 430/314 |
| 6,337,463 B1 | * | 1/2002 | Gaku et al. ............... | 219/121.7 |
| 6,346,678 B1 | * | 2/2002 | Kono et al. .................. | 174/255 |
| 6,492,616 B1 | * | 12/2002 | Tanaka et al. .......... | 219/121.71 |
| 2002/0033387 A1 | * | 3/2002 | Kurosawa et al. ..... | 219/121.72 |
| 2003/0146196 A1 | * | 8/2003 | Kurosawa et al. ..... | 219/121.72 |

FOREIGN PATENT DOCUMENTS

| | | |
|---|---|---|
| EP | 935407 A1 | 8/1999 |
| JP | 09-107168 A | 4/1997 |
| JP | 10-323777 A | 12/1998 |
| JP | 11-284348 A | 10/1999 |
| JP | 2002-118344 A | 4/2002 |

* cited by examiner

Primary Examiner—Geoffrey S. Evans
(74) Attorney, Agent, or Firm—Sughrue Mion, PLLC

(57) ABSTRACT

In a carbon dioxide laser machining method of a multilayer material of applying carbon dioxide laser light to a machined part of a multilayer material having an insulation layer and a first conductor layer and a second conductor layer deposited with the insulation layer between and removing the first conductor layer and the insulation layer of the machined part to form a blind hole or a groove arriving at the second conductor layer, the laser light is applied to the machined part like pulses at an energy density of 25 J/cm$^2$ or more for beam ON time in the range of 1 µs to 10 µs.

3 Claims, 11 Drawing Sheets

○ COPPER FOIL 12 μm THICK CAN BE REMOVED
× COPPER FOIL 12 μm THICK CANNOT BE REMOVED

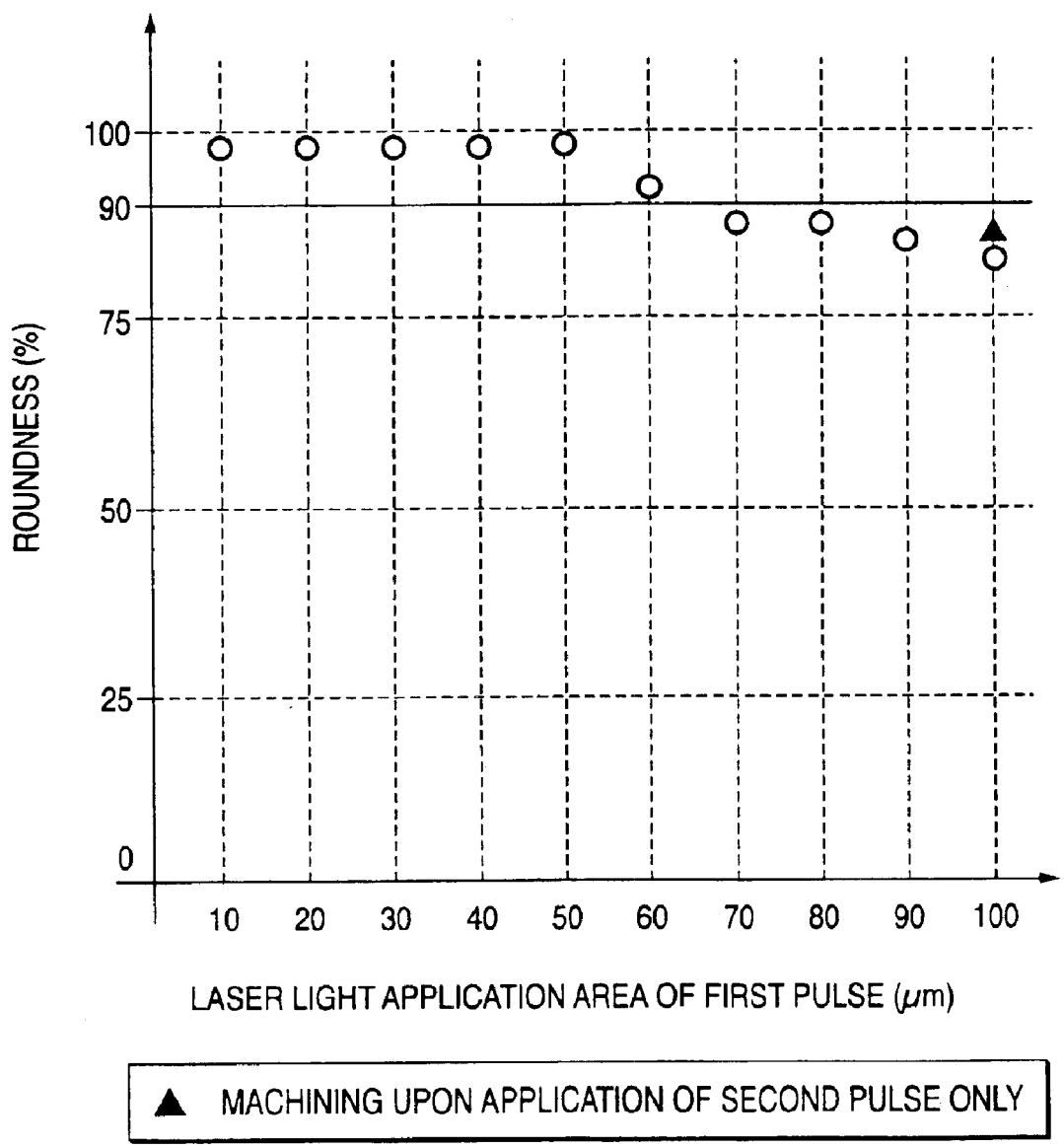

TEMPERATURE DISTRIBUTION AFTER SECOND PULSE IS APPLIED

CARBON DIOXIDE GAS LASER MACHINING METHOD OF MULTILAYER MATERIAL

TECHNICAL FIELD

This invention relates to a carbon dioxide laser machining method of a multilayer material for forming a through hole and a blind hole to electrically connect a plurality of conductor layers in a multilayer wiring board called a printed wiring board.

BACKGROUND ART

Generally, a printed wiring board is a board having conductor layers 4 and 5 made of copper foil on both sides of an insulation layer 1 formed by impregnating glass cloth 3 with resin 2 and hardening, as shown in FIG. 9; a printed wiring board of a board shape made up of multiple layers as shown in FIG. 10 is also available.

Hitherto, the following two methods for forming a blind hole to electrically connect the conductor layers 4 and 5 on both sides of the insulation layer 1 in such a printed wiring board have been available:

The first method is a method using carbon dioxide laser light, wherein the conductor layer 4 on the laser light incidence side is removed by any other method than the carbon dioxide laser light, such as etching or drilling, and then only the insulation layer is machined by applying laser light using the fact that the carbon dioxide laser light is almost reflected on the conductor layer although it is well absorbed in the insulation layer 1.

The second method is a method using solid state (YAG, etc.,) laser light, wherein a blind hole is formed only by applying laser light using the fact that the solid state laser light is well absorbed in both the insulation layer and the conductor layer unlike the carbon dioxide laser light.

However, to remove the conductor layer by drilling in the first method, it is difficult to make fine adjustment in the depth direction and it is impossible to stably remove the conductor layer so as not to cause damage to the conductor layer 5 on the bottom. To remove the conductor layer by etching, there is a problem of increasing the cost because the etching process is complicated.

Further, to remove the conductor layer 4 and the insulation layer 1 by applying solid state (YAG, etc.,) laser light in the second method, there is a problem of increasing the production cost because the solid state laser running cost is high.

Considering the problems, at present both the conductor layer 4 and the insulation layer 1 are machined to form a blind hole only by applying the carbon dioxide laser light.

Specifically, to machine the conductor layer based on the carbon dioxide laser light, reflection of the carbon dioxide laser light on the conductor layer on the laser light incidence side is remarkable large and thus energy of the carbon dioxide laser light applied to stably machine the conductor layer is made fairly large as compared with the case where only the insulation layer is machined.

If carbon dioxide laser light of fairly large energy is applied for machining as described above to reliably remove the conductor layer 4 for a printed wiring board as shown in FIG. 11A, while one-pulse laser light is being applied, the machining is advanced in the order of FIGS. 11B, 11C, 11D, and 11E and as shown in 11E, the conductor layer 4 on the laser light incidence side is projected into a hole, the hole shape becomes a middle swell shape, or damage to an inner conductor layer 5 occurs; this is a problem. The reason why such a problem occurs is that excessive heat is input to the insulation layer 1 because the energy of the carbon dioxide laser light is made large to machine the conductor layer 4. The laser light incidence side where machining is performed, namely, the conductor layer 4 on the surface reflects the carbon dioxide laser light remarkably largely and the heat input amount and the thermal diffusion direction after heat input do not become stable and thus the roundness of a machined hole easily worsens and there is a problem of how to enhance the roundness of a machined hole.

DISCLOSURE OF INVENTION

The invention is intended for solving the problems and it is an object of the invention to provide a carbon dioxide laser machining method of a multilayer material wherein when a conductor layer on the laser light incidence side is removed, carbon dioxide laser light is optimized, whereby the conductor layer on the laser light incidence side is stably removed and the hole shape does not becomes a middle swell shape.

To accomplish the object, according to a first aspect of the invention, there is provided a carbon dioxide laser machining method of a multilayer material of applying carbon dioxide laser light to a machined part of a multilayer material having an insulation layer and a first conductor layer and a second conductor layer deposited with the insulation layer between and removing the first conductor layer and the insulation layer of the machined part to form a blind hole or a groove arriving at the second conductor layer, wherein the laser light is applied to the machined part like pulses at an energy density of 25 J/cm$^2$ or more for beam ON time in the range of 1 $\mu$s to 10 $\mu$s.

When the first conductor layer of the machined part is removed by applying a plurality of pulses, the application beam diameter of the later applied pulse is made larger than that of the earlier applied pulse.

BRIEF DESCRIPTION OF DRAWINGS

FIG. 7 is a drawing to show the roundness of a machined hole relative to the laser light application area.

BEST MODE FOR CARRYING OUT THE INVENTION

Figure 1A:
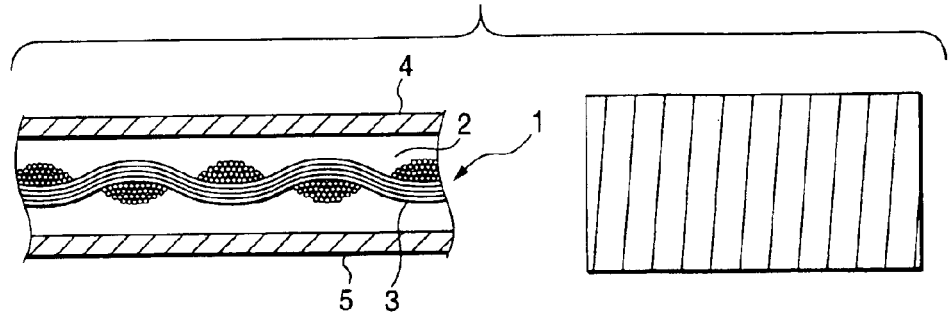
FIGS. 1A to 1C are drawing to show the process of machining by a laser machining method according to a first embodiment of the invention.

First Embodiment.

A carbon dioxide laser machining method of a multilayer material according to a first embodiment of the invention will be discussed with FIGS. 1A to 5.

In the embodiment, a wiring board having conductor layers 4 and 5 on the surface and back of an insulation layer 1 formed by impregnating glass cloth 3 with resin 2 and hardening is formed with a blind hole to electrically connect the conductor layer 4 on the laser light incidence side and the conductor layer 5 on an opposite side.

The glass cloth 3 exists to improve the electric reliability of the board and the board strength and may be replaced with any other material and may not necessarily exist.

Here, the printed wiring board machined using the carbon dioxide laser machining method of a multilayer material according to the embodiment has the conductor layer 4 being copper foil 12 $\mu$m thick, the conductor layer 5 being copper foil 18 $\mu$m thick, and the board 1 being epoxy 80 $\mu$m thick as shown in FIG. 1A. The hole diameter of a target blind hole is $\phi$100 $\mu$m.

Figure 1B:
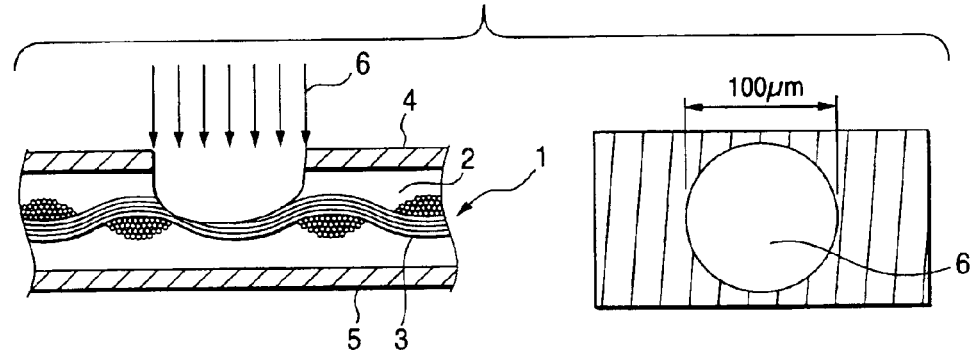

To begin with, as shown in FIG. 1B, as the first pulse, carbon dioxide laser light 6 with the pulse beam ON (beam application) time being 3 $\mu$s and the energy density being 150 J/cm$^2$ is applied to the range of area $\phi$100 $\mu$m of the conductor layer 4 of the printed wiring board where removal is required, and the conductor layer 4 and some of the insulation layer 1 are removed.

In the removal, the laser light with the beam ON time ranging from 1 $\mu$s to 10 $\mu$s and the energy density being 25 J/cm$^2$ or more is used and thus as compared with the case where carbon dioxide laser light with the beam ON time shorter than 1 $\mu$s or carbon dioxide laser light with the beam ON time longer than 10 $\mu$s is applied to the same area at the same energy density, the energy of the carbon dioxide laser light is efficiently absorbed and consumed for removal of the conductor layer 4 and extra carbon dioxide laser light does not machine the insulation layer 1 unnecessarily largely, so that it is made possible to prevent the conductor layer 4 from being projected into the hole or the hole shape from becoming a middle swell shape upon application of one pulse.

Here, the reason why the energy of the carbon dioxide laser light is efficiently absorbed and consumed for removal of the conductor layer 4 and extra carbon dioxide laser light does not machine the insulation layer 1 unnecessarily largely will be discussed.

Figure 2:
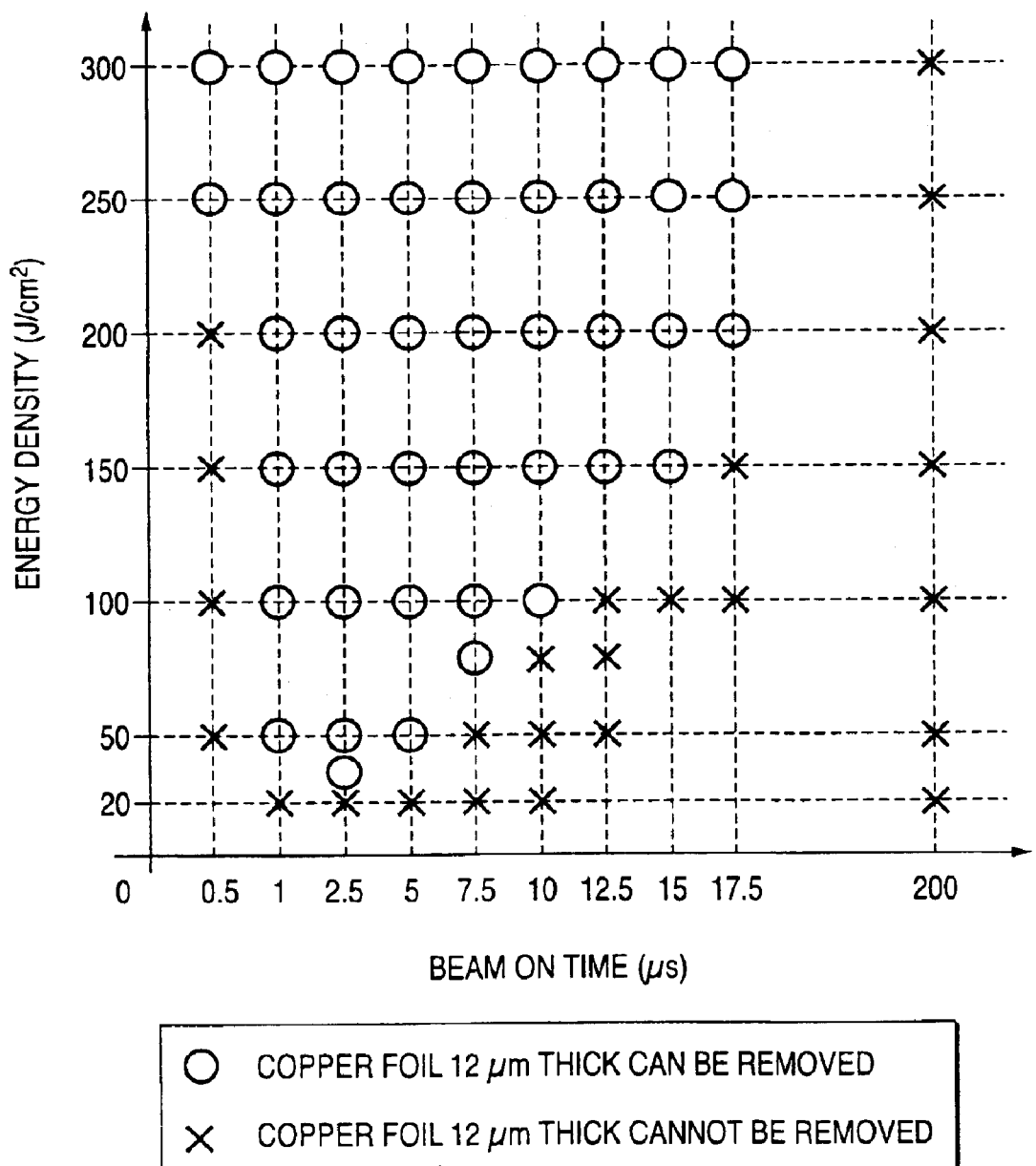
FIG. 2 is a drawing to show the removal characteristic of copper foil 12 $\mu$m thick upon application of laser light.

FIG. 2 indicates whether or not a conductor layer can be removed when the one-pulse beam ON time and the energy density are changed and laser light is applied to the conductor layer 12 $\mu$m thick as application area $\phi$100 $\mu$m; o indicates that the conductor layer can be removed and X indicates that the conductor layer cannot be removed.

The tendency of o and X in FIG. 2 becomes almost similar when the conductor layer has a thickness in the range of 3 to 12 $\mu$m.

The reason is that the absorption ratio of the carbon dioxide laser light depends largely on the reflection factor of laser light on the conductor layer surface rather than the thickness of the conductor layer.

It is seen in FIG. 2 that if the energy density is made constant when the beam ON time is 1 $\mu$s or more, the shorter the beam ON time, the more enhanced the conductor layer removal capability, making it possible to remove copper foil. The reason is that a predetermined power density (=energy density÷beam ON time) is required for machining the conductor layer 4. (A power density of 10$^7$ W/cm$^2$ or more is required to remove general copper foil 3 to 12 $\mu$m thick.)

If laser light with a long beam ON time and a low power density is applied, the conductor layer 4, namely, copper foil has high thermal conductivity and thus the heat absorbed in the copper foil escapes to the surroundings and the copper foil cannot efficiently be removed.

It is seen in FIG. 2 that when the beam ON time becomes less than 1 $\mu$s, a larger energy density is required to remove the conductor layer as compared with the case where the beam ON time is 1 $\mu$s or more.

Although power density is required to machine the conductor layer 4, since laser light with short beam ON time and too large power density is applied, it becomes difficult for the heat absorbed in the copper foil to diffuse to the surroundings and only the laser application part (copper foil) is heated excessively.

Since the laser light is consumed to excessively raise the temperature of the laser application part (copper foil), the removal volume per pulse becomes extremely small.

Figure 3:
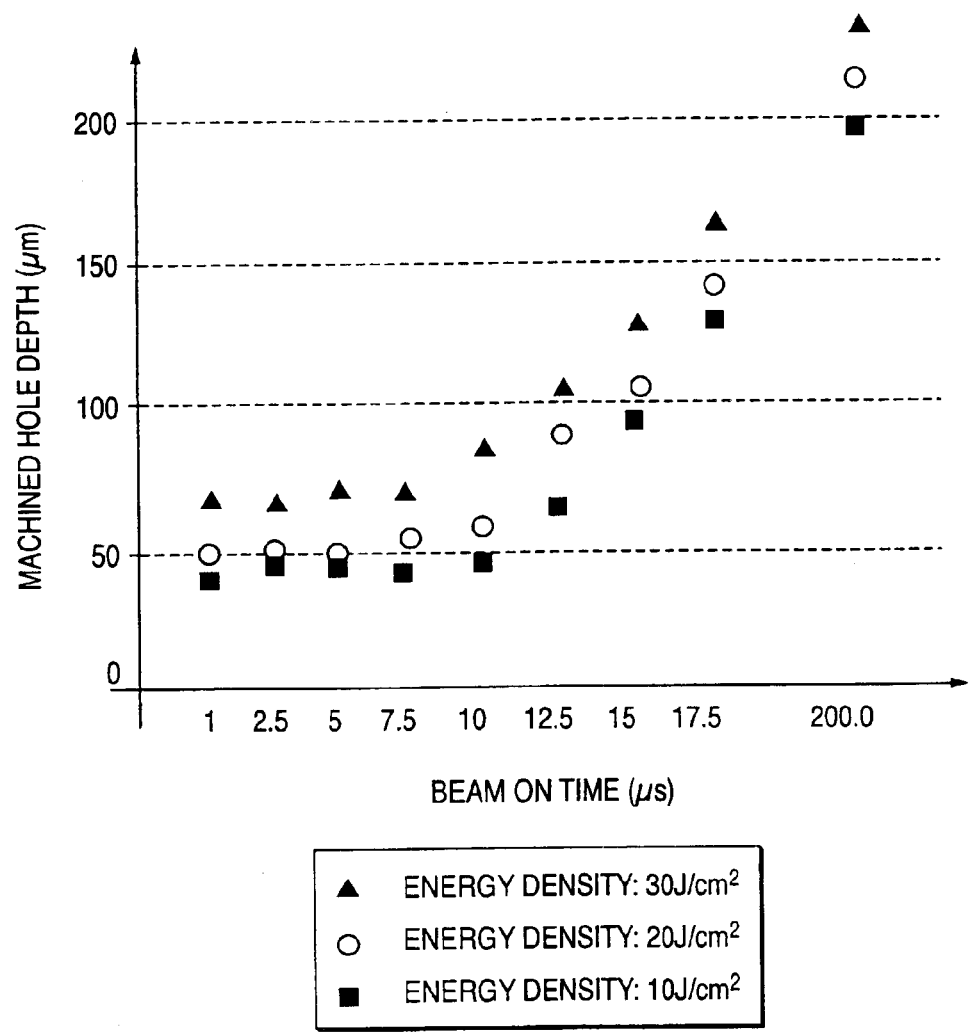
FIG. 3 is a drawing to show the relationship of machined hole depth with energy density and beam ON time.

Further, FIG. 3 shows the relationship between the beam ON time and the hole depth of the insulation layer 1 when the one-pulse energy density was set to 10, 20, and 30 J/cm$^2$ and laser light of application area $\phi$100 $\mu$m was applied to a board of only epoxy 500 $\mu$m thick.

It is seen in FIG. 3 that the longer the beam ON time and the larger the energy density, the deeper removed the insulation layer 1.

To remove the insulation layer 1 and form a blind hole made blind in the conductor layer 5, since the thickness of the insulation layer 1 is limited, after the removal depth arrives at the thickness of the insulation layer 1, removal of the insulation layer 1 proceeds in the perpendicular direction to the traveling direction of incident laser light and thus the blind hole becomes a middle swell shape.

If the same energy density is applied, the shorter the beam ON time, the higher the power density. Thus, before heat diffuses to the laser light application part surroundings, only the laser light application part (resin) is heated excessively and the temperature of the laser light application part becomes high and thus the removal volume per pulse becomes small and the hole depth becomes shallow.

In contrast, the longer the beam ON time, the lower the power density and thus heat diffuses to the laser light application part surroundings (depth direction), so that the removal volume per pulse becomes large and the hole depth becomes deep.

In the embodiment, the beam ON time is in the range of 1 $\mu$s to 10 $\mu$s, so that the hole depth becomes shallow because of the reason described above and after the conductor layer on the surface is removed, it is made possible to prevent the insulation layer from being removed deep more than necessary or the blind hole from becoming a middle swell shape.

Figure 4:
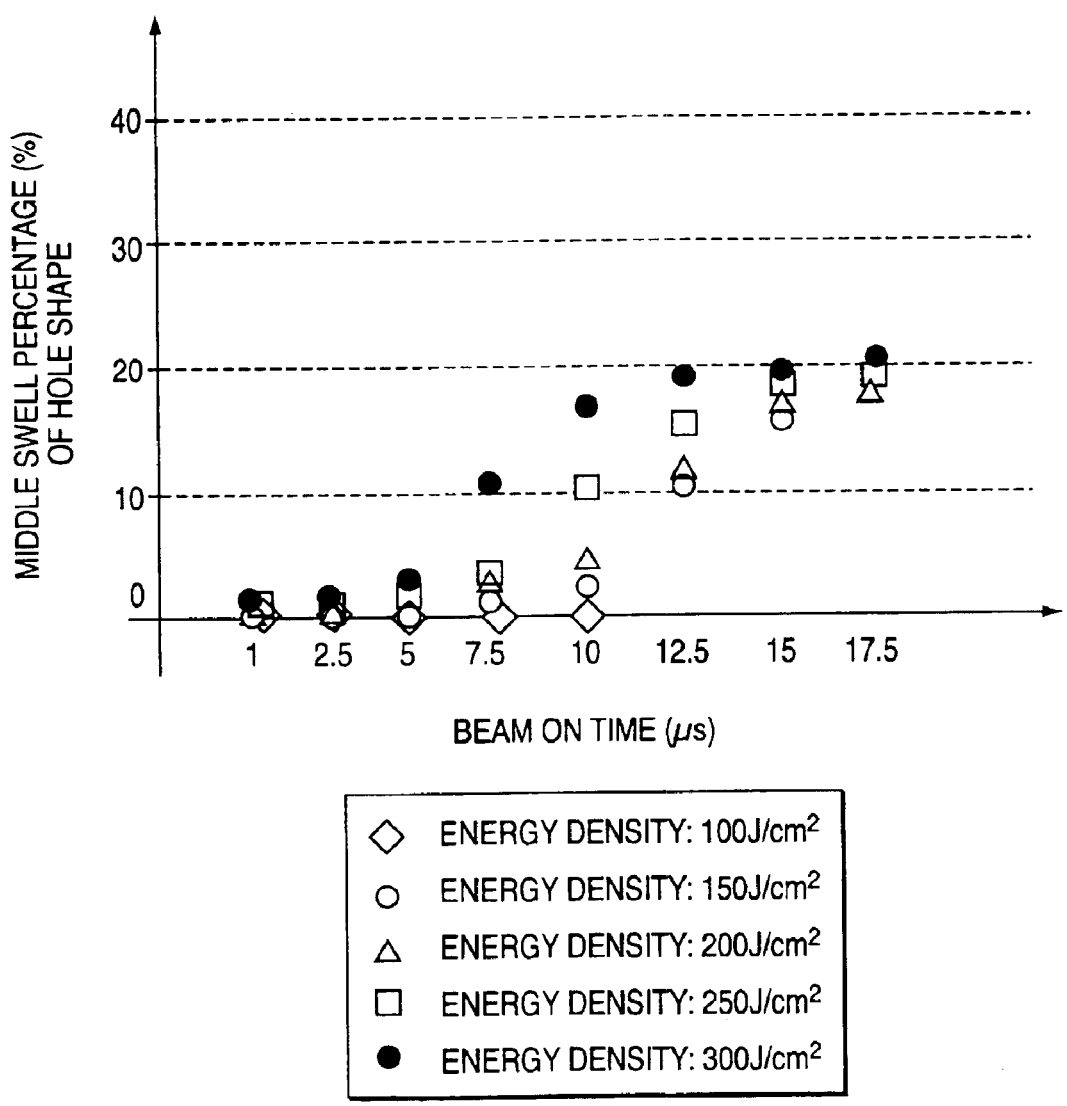
FIG. 4 is a drawing to show the middle swell percentage of hole shape relative to beam ON time.

Further, FIG. 4 shows the relationship between the beam ON time and the middle swell percentage of hole shape when the one-pulse energy density is set to 100, 150, 200, and 250 J/cm$^2$. The middle swell percentage of hole shape is calculated as follows:

(Middle swell percentage)=100×{(hole diameter of insulation layer)−(hole diameter of conductor layer on laser light incidence side)}/(hole diameter of conductor layer on laser light incidence side)

If the conductor layer projects into the hole or the hole shape does not becomes a middle swell shape, the middle swell percentage is set to 0 (%).

It is seen in FIG. 4 that the longer the beam ON time, the higher the middle swell percentage.

This means that if the pulse width is long, the power density becomes low and therefore the insulation layer is removed deep.

Further, it is seen that the larger the energy density, the higher the middle swell percentage.

This means that if the energy density is large, the insulation layer is removed deep.

Figure 5:
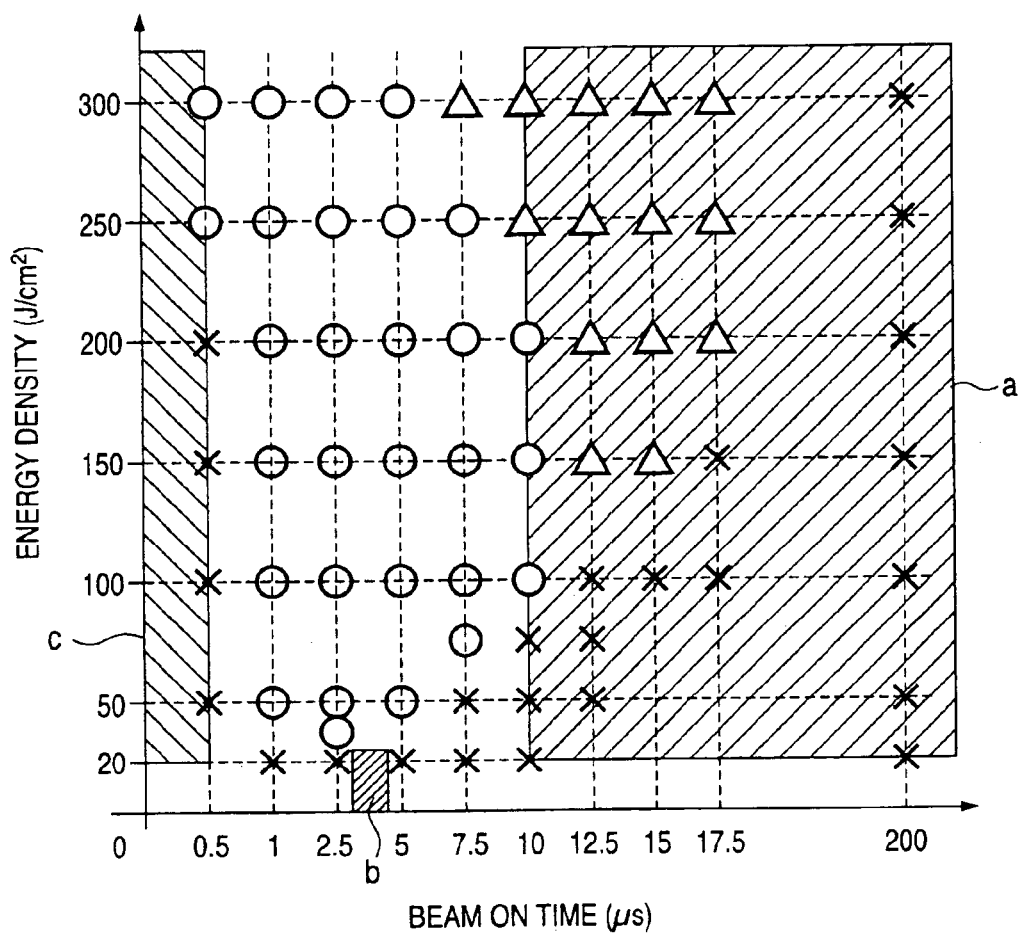
FIG. 5 is a drawing to show the removal characteristic of copper foil 12 $\mu$m thick upon application of laser light by a laser machining method as a comparison example.

It is seen in FIG. 5 provided by integrating the results in FIGS. 2 and 4 that when the beam ON time is in the range of 1 to 10 μs, surface copper foil can be removed and the middle swell percentage is 10% or less and therefore the beam ON time in the range is appropriate beam ON time. However, it seems that the appropriate beam ON time a little changes depending on the thicknesses of the conductor layer on the surface and the insulation layer.

JP-A-9-107168 proposes a laser machining method using laser light with the beam ON time ranging from 10 μs to 200 μs and the energy density being 20 J/cm$^2$ or more.

Area of a in FIG. 5 corresponding to the condition described in JP-A-9-107168 is fitted in the point of efficiently removing resin only, but not fitted in machining wherein compatibility between efficient removal of copper foil and prevention of a middle swell shape is required, intended by the specification.

JP-A-10-323777 proposes a laser machining method using laser light with the beam ON time ranging from 3 μs to 4 μs and the energy density being 22 J/cm$^2$ or less.

Area shown in b in FIG. 5 corresponds to the condition described in JP-A-10-323777, but in the area, the energy density is low as 22 J/cm$^2$ or less and energy density 25 J/cm$^2$ to stably remove the conductor layer cannot be provided and thus it is not fitted for machining wherein the conductor layer (copper foil, etc.,) needs to be removed efficiently, intended by the specification.

Figure 1C:
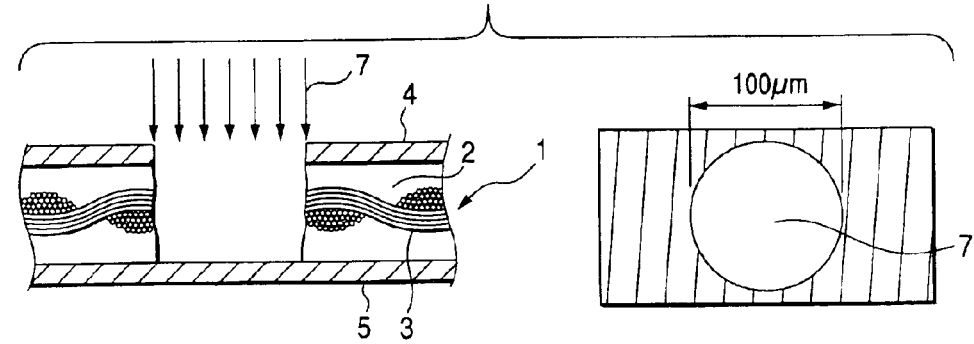

Next, to machine the insulation layer 1 as shown in FIG. 1B left after the laser light 6 is applied, after the laser light 6 as the first pulse is applied, laser light 7 as shown in FIG. 1C is applied as the second pulse and later, thereby machining the remaining insulation layer 1 for completing formation of the blind hole.

Here, the laser light 7 may machine only the insulation layer rather than the conductor layer and does not require the energy density or the pulse width as indicated in the patent and therefore it is desirable that laser light with the beam ON time ranging from 10 μs to 200 μs and the energy density being 20 J/cm$^2$ or more as proposed in JP-A-9-107168, etc., for example, fitted for removal machining of the insulation layer should be used.

Further, to prevent the hole shape from becoming a middle swell shape, it is desirable that the energy density should be lessened.

Figure 9:
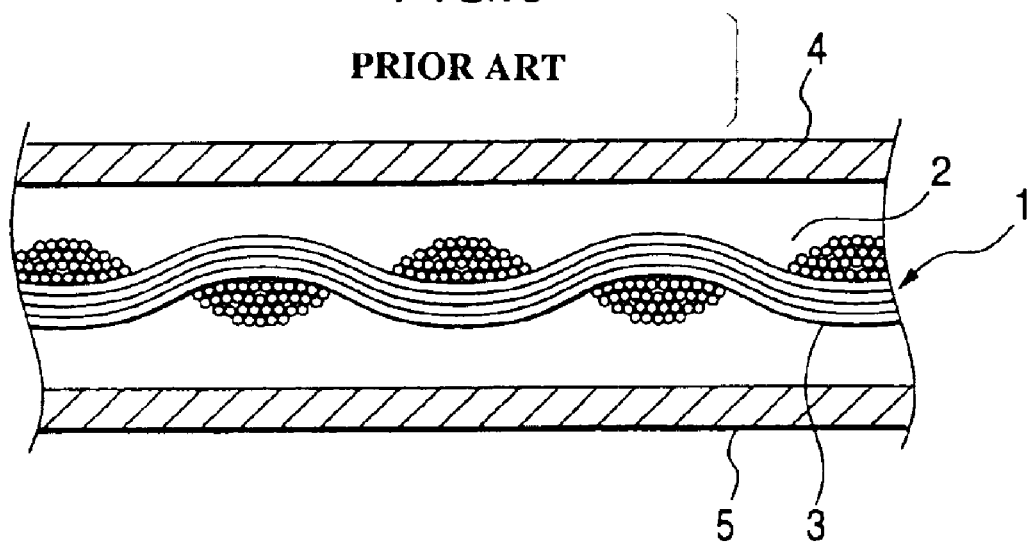
FIG. 9 is a sectional view of a general printed wiring board.
Figure 10:
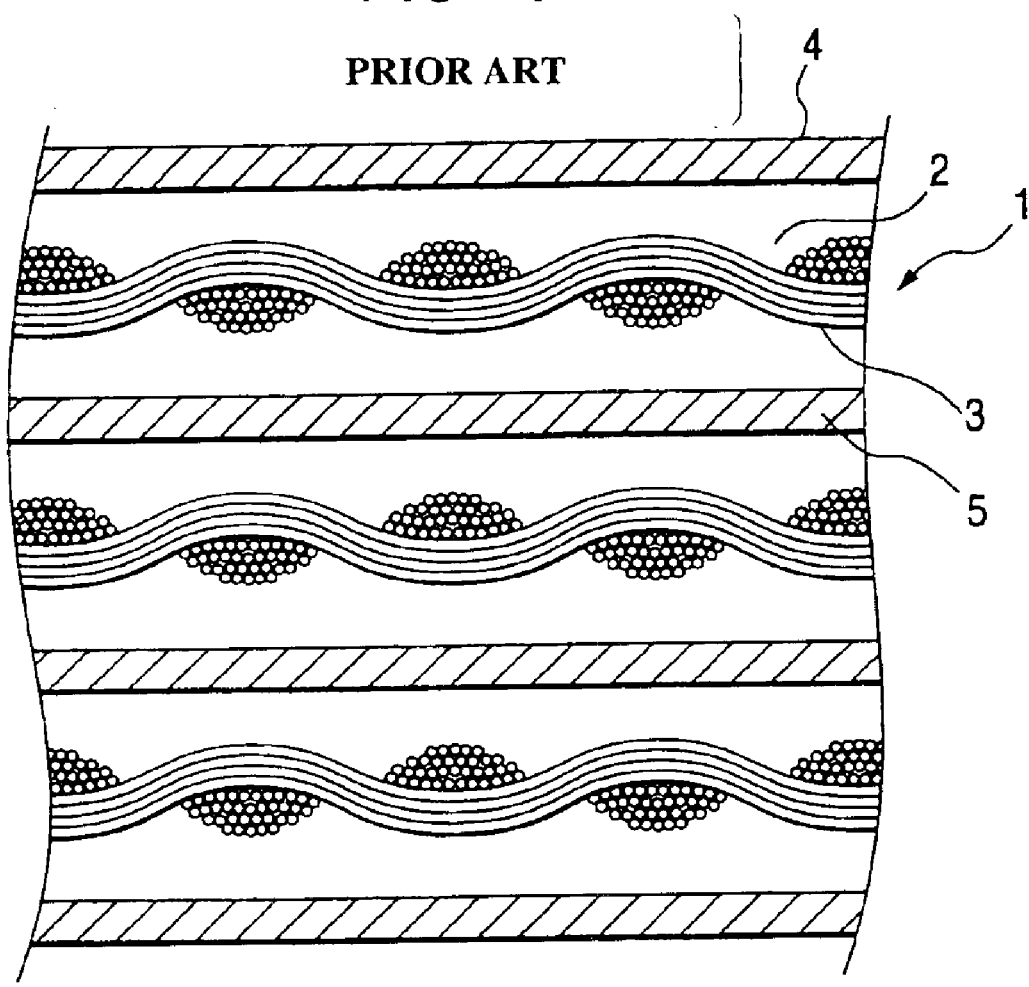
FIG. 10 is a sectional view of a general multilayer printed wiring board.
Figure 11A:
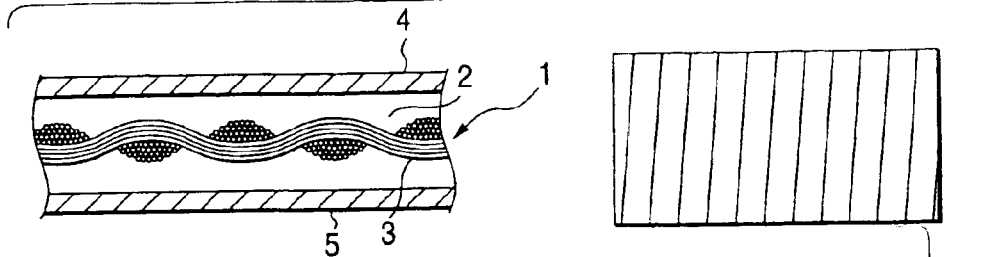
FIGS. 11A to 11E are drawing to show the process of machining by a laser machining method in a related art.
Figure 11B:
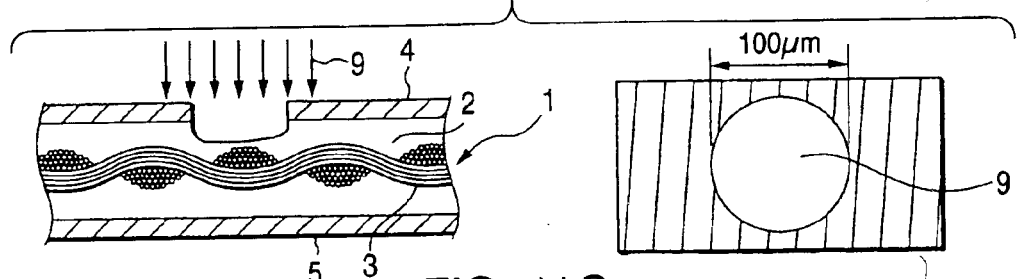
Figure 11C:
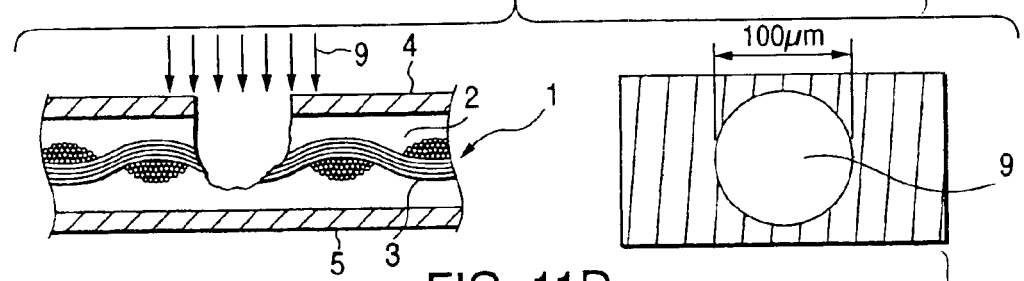
Figure 11D:
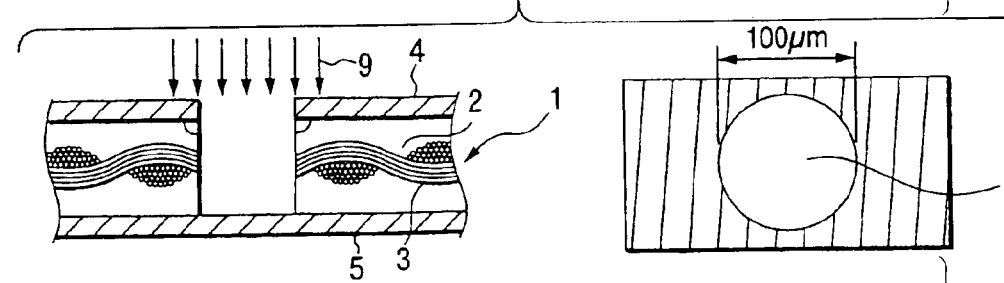
Figure 11E:
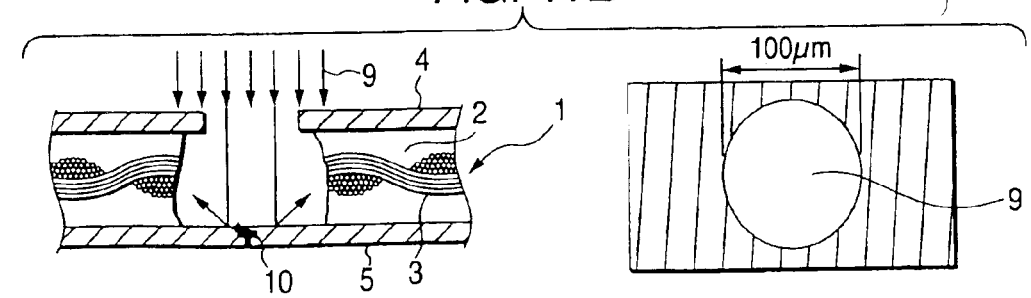

If the energy density is too high, as shown in FIG. 9E, excessive laser light is reflected by the conductor layer 5 and removes walls of the insulation layer and thus the hole shape becomes a middle swell shape.

In the embodiment, laser light is set to 15 μs and 50 J/cm$^2$, so that a good blind hole wherein surface copper foil is not projected with the hole shape prevented from becoming a middle swell shape without the machining remainder of the insulation layer can be formed.

Second Embodiment.

Figure 6A:
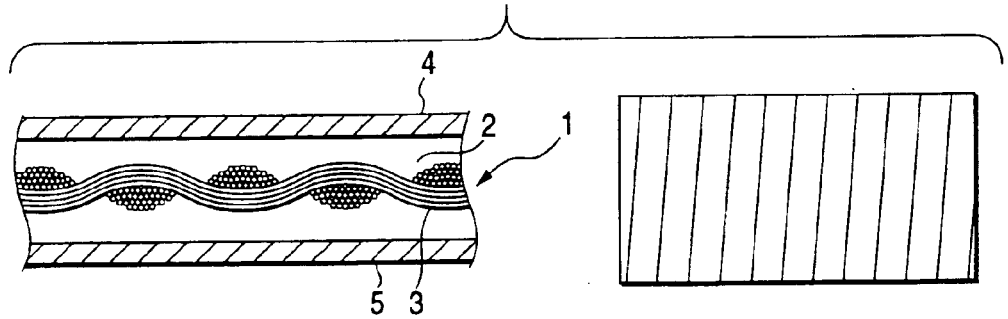
FIGS. 6A to 6D are drawing to show the process of machining by a laser machining method according to a second embodiment of the invention.
Figure 6B:
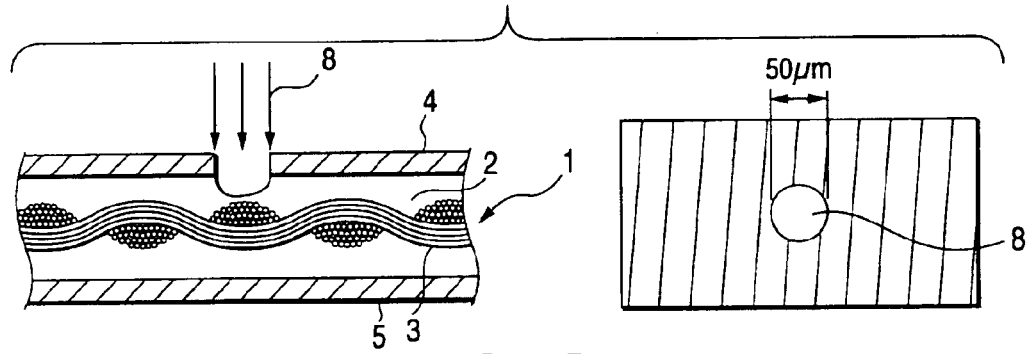

Next, a carbon dioxide laser machining method of a multilayer material according to a second embodiment of the invention will be discussed with FIGS. 6A to 8. To begin with, as shown in FIG. 6B, laser light 8 with the beam ON time being 3 μs and the energy density being 150 J/cm$^2$ is applied to a conductor layer 4 of a wiring board as shown in FIG. 6A in area φ50 μm smaller than area φ100 μm of the conductor layer 4 to be finally removed, and the conductor layer 4 and some of an insulation layer 1 are removed. In the removal, the laser light with the beam ON time ranging from 1 μs to 10 μs and the energy density being 25 J/cm$^2$ or more is used and thus the energy of the laser light is used to efficiently remove the conductor layer 4 and extra laser light does not machine the insulation layer 1 unnecessarily largely, so that it is made possible to prevent the conductor layer 4 from being projected into the hole or the hole shape from becoming a middle swell shape upon application of one pulse.

Figure 6C:
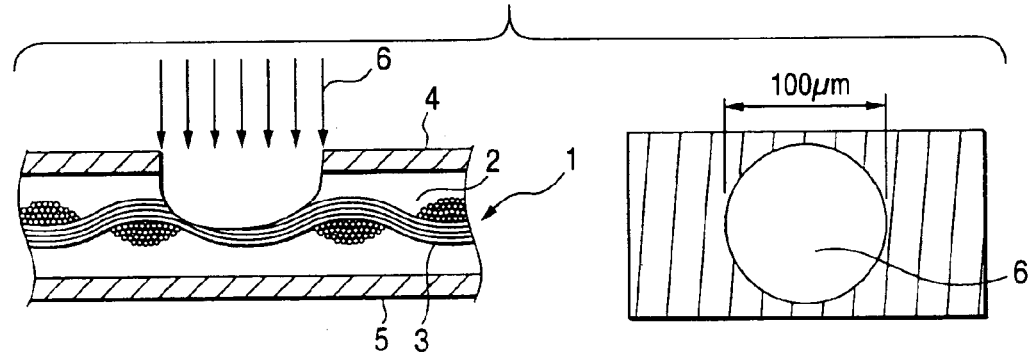
Figure 6D:
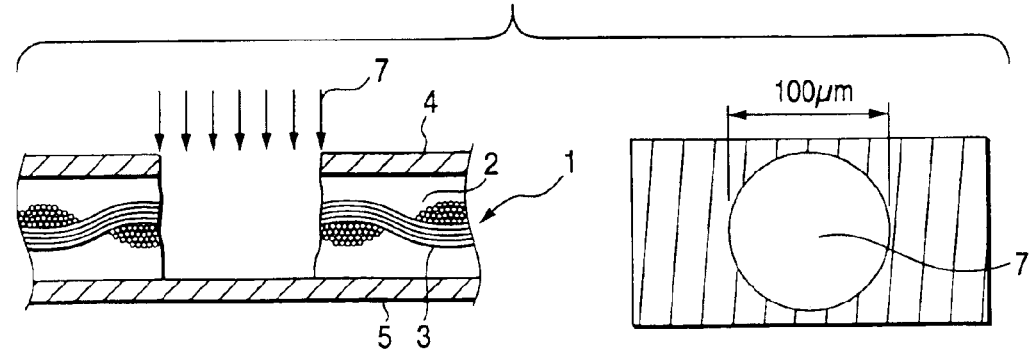

Next, as shown in FIG. 6C, laser light 6 with the beam ON time being 3 μs and the energy density being 150 J/cm$^2$ is applied to the area φ100 μm of the conductor layer 4 to be removed, overlapping the position of the machined hole in the conductor layer 4 after the laser light 8 is applied, thereby removing the conductor layer 4 of the large area.

FIG. 7 shows on the Y axis the roundness of machined hole (=100×short diameter/long diameter) upon application of two pulses of laser light different in application area to copper foil 12 μm thick and shows the laser light application area of the first pulse on the X axis. The laser light application area of the second pulse is fixed to φ100 μm. It is seen in the figure that when the application area of the first pulse is φ60 μm or less, the roundness is improved. Generally, the roundness of machined hole needs to be 90% or more.

To remove the conductor layer by applying one pulse only, if the conductor surface is dirty or contains a flaw and a portion in which the laser light absorption ratio is high exists, a temperature rise occurs from the portion. In this case, if the portion in which the absorption ratio is high does not exist at the laser light application center, the temperature distribution easily becomes an ellipse rather than a perfect circle, as shown in FIG. 8B. Thus, to apply one pulse, the roundness of the machined hole is easily degraded.

Figure 8A:
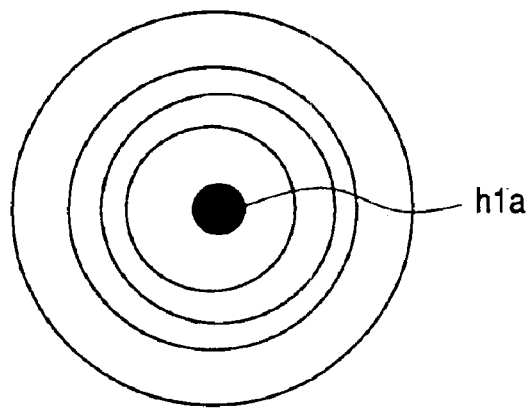
FIGS. 8A and 8B are drawing to show the temperature distribution of a machined part.
Figure 8B:
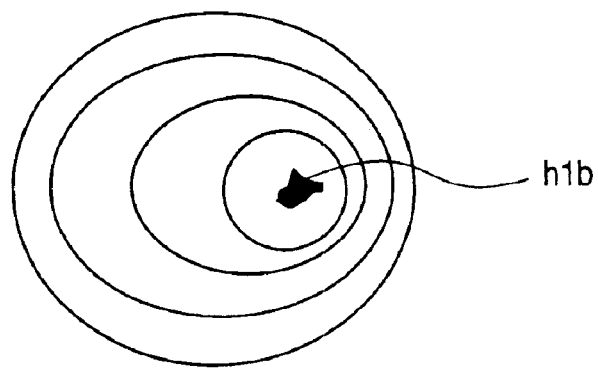

However, to remove the conductor layer by applying two pulses different in beam diameter, FIGS. 8A and 8B shows the temperature distribution of a machined part upon application of laser light of two pulses or more, and a small-diameter hole is machined by applying the first pulse and then large laser light is applied, whereby a temperature rise during the laser light application of the second pulse occurs radially with the hole formed by applying the first pulse as the center, so that the temperature distribution becomes a circle with the hole formed by applying the first pulse as the center, as shown in FIG. 8A. Since the removal phenomenon occurs in accordance with the temperature distribution, a machined hole having high roundness can be provided.

JP-A-9-239573 proposes a laser machining method of machining by applying laser light with the beam ON time ranging from 10 μs to 20 μs as the first pulse and machining by applying laser light of a larger application area than that at the first pulse with the beam ON time being 200 ns or less as the second pulse. However, the purpose of making the laser light application area of the second pulse larger than that of the first pulse is to remove a thermal deterioration layer and a resin remaining film in an insulation layer and the purpose of changing the beam diameter and the beam ON time area (range shown in c in FIG. 5) also differ from those in the laser machining method of the invention.

Next, in FIG. 6C, to machine the insulation layer 1 left after application of the laser light 8 and the laser light 6 (two pulses), after the laser light 6 is applied, laser light under the condition equivalent to the laser light 7 shown in FIG. 1D is applied for machining the remaining insulation layer 1, whereby a blind hole is formed by applying a total of three pulses. In the embodiment, the laser light of the third pulse is set to 1 μs and 50 J/cm$^2$, so that a good blind hole having high roundness of surface wherein surface copper foil is not projected with the hole shape prevented from becoming a middle swell shape without the machining remainder of the insulation layer can be formed.

As described above, the laser machining method according to the invention provides the advantage that the conductor layer on the surface can be prevented from being projected into the hole and the hole shape can be prevented from becoming a middle swell shape by applying laser light to the machined part like pulses at an energy density of 25 J/cm$^2$ or more for the beam application time in the range of 1 μs to 10 μs.

INDUSTRIAL APPLICABILITY

As described above, the carbon dioxide laser machining method according to the invention is suited for a carbon dioxide laser machining method of a multilayer material for forming a through hole and a blind hole to electrically connect a plurality of conductor layers.

What is claimed is:

1. A carbon dioxide laser machining method of a multilayer material, comprising:

applying carbon dioxide laser light to a machined part of a multilayer material having an insulation layer, and a first conductor layer and a second conductor layer deposited with the insulation layer in between; and removing the first conductor layer and the insulation layer of the machined part to form one of a blind hole and a groove to a depth of the second conductor layer, such that a portion of the second conductor layer is not removed, wherein the laser light is applied to the machined part in the form of pulses at an energy density of 25 J/cm$^2$ or more with a beam ON time in the range of 1 μs to 10 μs, and wherein the first conductor layer is removed with the laser light.

2. The method according to claim 1, wherein said energy density is greater than 40 J/cm$^2$.

3. A carbon dioxide laser machining method of a multilayer material of applying carbon dioxide laser light to a machined part of a multilayer material having an insulation layer and a first conductor layer and a second conductor layer deposited with the insulation layer between and removing the first conductor layer and the insulation layer of the machined part to form a blind hole or a groove arriving at the second conductor layer, characterized in that the laser light is applied to the machined part in the form of pulses at an energy density of 25 J/cm$^2$ or more with a beam ON time in the range of 1 μs to 10 μs, wherein when the first conductor layer of the machined part is removed by applying a plurality of pulses, the application beam diameter of later applied pulses is made larger than that of earlier applied pulses.

* * * * *